(12) United States Patent
Boardman et al.

(10) Patent No.: US 7,300,684 B2
(45) Date of Patent: *Nov. 27, 2007

(54) METHOD AND SYSTEM FOR COATING INTERNAL SURFACES OF PREFABRICATED PROCESS PIPING IN THE FIELD

(75) Inventors: William John Boardman, Colorado Springs, CO (US); Andrew William Tudhope, Danville, CA (US); Raul Donate Mercado, Danville, CA (US)

(73) Assignee: Sub-One Technology, Inc., Pleasanton, CA (US)

( * ) Notice: Subject to any disclaimer, the term of this patent is extended or adjusted under 35 U.S.C. 154(b) by 512 days.

This patent is subject to a terminal disclaimer.

(21) Appl. No.: 10/891,983

(22) Filed: Jul. 15, 2004

(65) Prior Publication Data

US 2006/0011468 A1    Jan. 19, 2006

(51) Int. Cl.
*C23C 16/00*    (2006.01)
*C23C 14/35*    (2006.01)

(52) U.S. Cl. ............... 427/249.7; 427/249.1; 427/523; 427/524; 427/530; 427/528; 427/534; 427/569; 204/192.3; 204/192.32; 118/723 R; 118/723 E; 118/708; 118/663

(58) Field of Classification Search ............. 204/192.3, 204/192.32; 427/523, 524, 530, 528, 534, 427/569, 249.1, 249.7; 118/723 R, 723 E, 118/708, 663
See application file for complete search history.

(56) References Cited

U.S. PATENT DOCUMENTS

| | | | |
|---|---|---|---|
| 4,407,712 A | 10/1983 | Henshaw et al. | 204/298 |
| 4,714,589 A | 12/1987 | Auwerda et al. | 427/39 |
| 5,026,466 A | 6/1991 | Wesemeyer et al. | 204/192.38 |
| 5,368,937 A * | 11/1994 | Itoh | 428/408 |
| 5,712,000 A * | 1/1998 | Wei et al. | 427/573 |
| 5,879,763 A * | 3/1999 | Sugiyama et al. | 427/577 |

(Continued)

FOREIGN PATENT DOCUMENTS

JP    63-026373    2/1988

(Continued)

OTHER PUBLICATIONS

Machine Translation of 09-195036 dated Jul. 1997.*

*Primary Examiner*—Rodney G. McDonald
(74) *Attorney, Agent, or Firm*—Law Offices of Terry McHugh

(57) ABSTRACT

The coating of internal surfaces of a workpiece is achieved by connecting a bias voltage such that the workpiece functions as a cathode and by connecting an anode at each opening of the workpiece. A source gas is introduced at an entrance opening, while a vacuum source is connected at an exit opening. Pressure within the workpiece is monitored and the resulting pressure information is used for maintaining a condition that exhibits the hollow cathode effect. Optionally, a pre-cleaning may be provided by introducing a hydrocarbon mixture and applying a negative bias to the workpiece, so as to sputter contaminants from the workpiece using argon gas. Argon gas may also be introduced during the coating processing to re-sputter the coating, thereby improving uniformity along the length of the workpiece. The coating may be a diamond-like carbon material having properties which are determined by controlling ion bombardment energy.

25 Claims, 3 Drawing Sheets

U.S. PATENT DOCUMENTS

| | | | |
|---|---|---|---|
| 6,129,856 A | 10/2000 | Jung et al. | 216/63 |
| 6,488,825 B1 | 12/2002 | Hilliard | 204/298.06 |
| 6,663,755 B2 | 12/2003 | Gorokhovsky | 204/298.41 |
| 2002/0039626 A1* | 4/2002 | Nakahigashi et al. | 427/569 |
| 2004/0112536 A1* | 6/2004 | Quon | 156/345.28 |

FOREIGN PATENT DOCUMENTS

| | | | |
|---|---|---|---|
| JP | 09-195036 | * | 7/1997 |
| JP | 2001200369 A | | 7/2001 |

* cited by examiner

METHOD AND SYSTEM FOR COATING INTERNAL SURFACES OF PREFABRICATED PROCESS PIPING IN THE FIELD

TECHNICAL FIELD

The invention relates generally to plasma enhanced chemical vapor deposition systems and more specifically to coating piping systems in the field.

BACKGROUND ART

Often the assembly of the various components of a piping system adversely affects the properties of the material used for piping. For example, welding of the high purity 316L stainless steel tubing used to supply process gas for semiconductor manufacturing equipment can change the properties of the stainless steel. The change is due to heating and vapor plume effects, such that when the gasline is filled with a corrosive gas (e.g., $SiCl_2H_2$), it is usually the heat effected zone (welded area) that is most likely to exhibit corrosion failure. This is also true for the exhaust piping that forms the path from pumps to scrubbers.

Much effort has been expended in improving the corrosion resistance of specialty metal alloys, for example stainless steel, by precisely defining chemistry levels (e.g., 16 to 18% Cr in 316L SS) and decreasing impurity levels (e.g., less than 0.03% S and C in 316L SS) that remain after melting and refining. This requires specialized steel manufacturing methods, such as vacuum oxygen decarburization (VOD), vacuum induction melting (VIM) and vacuum arc remelting (VAR), which add significant cost. An additional problem with low impurity steel is that machinability, hardness and other relevant considerations can be negatively affected. Expensive post machining processing, such as burnishing and electropolishing, often must be performed in order to meet hardness and surface roughness requirements specified by organizations, particularly Semiconductor Equipment and Materials International (SEMI). One solution to these issues is to coat a lower grade base material with a high quality coating material having the desired mechanical, electrical or optical properties (e.g., high hardness and corrosion resistance). Typically, these types of properties will be found in metal, ceramic or diamond-like coatings.

Other expensive specialty alloys, such as Hastelloy and Inconel (both of which are federally registered trademarks of Huntington Alloys Corporation), are commonly used for exhaust piping in not only the semiconductor industry, but in chemical processing industries in general. These alloys exhibit high temperature strength and corrosion resistance. Again, a less expensive base material can be used if a suitable surface coating is applied to the interior surface which is to be exposed to the corrosive environment.

A fundamental concern in the use of high-grade metals or metal coatings for corrosion resistance is that the assembly of the high purity metal components often includes welding of the various components. As previously noted, the heat associated with the welding process can change the chemistry of the steel or the coating. As a consequence of differences in vapor pressures of the various components, some material will vaporize and re-deposit downstream on the surface. This change in chemistry can destroy the effort placed on manufacturing the steel to be corrosion resistant and has been shown to be a major source of corrosion failures that cause particulate and contamination problems and ultimately can cause system failure and health and safety issues as a result of leaks.

Prior art coating methods include chemical vapor deposition (CVD), physical vapor deposition (PVD), plasma spray, electroplating and sol-gel. Of these methods, CVD and PVD provide the highest quality films with regard to purity, adhesion, uniformity and other properties. Both of these techniques require the use of a specialized vacuum chamber, making it difficult to coat fully assembled components. In the case of piping or tubing for carrying corrosive material, the interior surface that is in contact with the corrosive material must be coated. For very low pressure techniques such as PVD, where the pressure is below or near the molecular flow region, coating interior surfaces has been limited to only large diameter and short length (small aspect ratio) tubes. Similarly, CVD techniques are limited to such applications, due to the need to supply heat for the chemical reaction, which can damage heat-sensitive substrates. Plasma enhanced CVD (PECVD) can be used to lower the temperature required for reaction, but there is then difficulty in maintaining uniform plasma inside the pipe and in preventing depletion of source gas as it flows down the pipe.

The plasma immersion ion implantation and deposition (PIIID) technique has been shown to be useful for coating the external surfaces of complex shapes. PIIID is performed by applying a negative bias to the workpiece, which will pull positive ions toward the workpiece, if the plasma sheath is conformal. There are also improvements that can be made to film properties such as adhesion and film density via ion bombardment of the workpiece.

Methods of coating the interior surface of tubes have been described whereby the source material to be applied is inserted into the tube and then sputtered or arced off onto the tube. For example, U.S. Pat. No. 5,026,466 to Wesemeyer et al. describes a method of inserting a cathode into a tube and arcing the cathodic material onto the inside of the tube. U.S. Pat. No. 4,407,712 to Henshaw et al. describes a hollow cathode with a high evaporation temperature metal source inserted into a tube, with a cathode arc removing the source material from the hollow cathode and coating the inside surface of the tube. This type of arrangement has several drawbacks, including being limited to only large diameter tubes (due to having to insert the hollow cathode tube with associated heat shield and cooling tubes into the tube to be coated), the requirement of complicated arrangements for motion of anode and hollow cathode through the tube, and the generation of macro-particles by cathodic arc.

The known types of methods have the disadvantage of having to be performed at a remote location in a specialized vacuum chamber. This precludes the ability to coat all the welded sections of a long run of corrosive gasline or exhaust piping after welding has been completed. U.S. Pat. No. 4,714,589 to Auwerda et al. describes coating the inside of a tube by plasma activated deposition of a gas mixture, but this method is limited to electrically insulative tubes and coatings, and involves a complicated system for moving a microwave source along the outside of the tube. A less complex approach is sought.

SUMMARY OF THE INVENTION

A method in accordance with the present invention allows coating of internal surfaces of a pipe or tube ("workpiece") to be performed in the field (in situ) by using the workpiece itself as a deposition chamber. Prior to applying the coating material, the workpiece may be welded and otherwise assembled to other components (e.g., adjoining pipes or tubes) of a larger tubing system in which the workpiece is to function. The phrase "in the field" is defined herein as the location remote from the manufacture of the workpiece to be coated and local to the assembly of the workpiece to other components of a tubing system.

The method includes introducing a source gas from a gas supply subsystem connected to a first anode at the entrance of the completed tubing system. It also includes connecting a pumping subsystem to a second anode at an exhaust end of the welded tubing system and connecting a voltage biasing system such that the workpiece is biased negative and the anodes are grounded, with the anodes being separated from the conductive tubing by isolative spacers. The gas flow and the pumping speed are adjusted such that the pressure in the workpiece provides a hollow cathode in the workpiece upon application of a voltage bias. This pressure is such that the electron mean free path is slightly less than the diameter of the tube, causing electrons to oscillate across the tube and resulting in multiple ionizing collisions and a more intense plasma. This provides an improvement relative to prior art PECVD approaches in which plasma is generated externally from a workpiece, resulting in a loss of ionization as gas flows through the tube, so that less film deposition occurs toward the exit from the workpiece. In comparison, the invention achieves a more uniformly ionized plasma along the length of the workpiece, thereby providing a more uniform deposition.

Optical detectors and langmuir probes are provided at the anode connections at the gas inlet and pump ends. These detectors are used to monitor plasma intensity so that information regarding the intensity level of the hollow cathode plasma is fed back to a control system.

The method allows coating of interior surfaces of pipes or tubes to be performed in the field or at a coating service location much more easily and at reduced cost, as compared to remotely coating smaller sections in a vacuum deposition chamber. Moreover, the method may be performed without the requirement of inserting source metal electrodes into the workpiece or the need for complicated arrangements for the movement of the tube or the cathode. In the preferred embodiment, the method is accomplished by using the workpiece as a PECVD deposition chamber. Prior to the coating method, the workpiece should be welded and assembled to adjoining components of the intended tubing system, where the adjoining components are also to be coated or where the assembly process requires heating (e.g., welding) of the workpiece.

In principle, any metal, ceramic or DLC coating can be applied that has the desired properties of hardness and corrosion resistance (e.g., TiN, CrN, etc.). However, for coatings applied in the field, a non-toxic gas is employed. A diamond-like carbon (DLC) precursor such as methane, acetylene or toluene is used as the source gas in the preferred embodiment. DLC has been shown to provide a hard, corrosion-resistant, and low friction coating. Properties of this film can be tailored by adjusting the sp3 (diamond), sp2 (graphite) and sp1 (linear) bonding hybridization ratios in the film. Hydrogen content will also affect film properties. Typically, the highest sp3 ratio (most diamond-like) is obtained by methane, but this also produces a lower deposition rate compared to higher carbon molecules and also a higher compressive stress, limiting film thickness to approximately 5000 Å. The addition of certain dopants (e.g., silicon or silicon oxide) to the DLC matrix will improve thermal stability and can reduce compressive stress. An organic-based precursor, such as hexemethyldisiloxane ($C_6H_{18}Si_2O$) can be mixed with the hydrocarbon precursor(s) to introduce these dopants.

Film properties can thus be tailored by selection of the precursor gas or layered films can be deposited. For example, if it is necessary for a particular process (e.g., very rough welds) to have a thick deposited coating, the above process can be modified by deposition of a thin methane-based layer, followed by the use of a higher deposition rate, lower stress precursors such as toluene, or by higher energy ion bombardment to increase adhesion and reduce stress. The trade-offs between desired mechanical, electrical or optical film properties and deposition rate and stress for given precursors and bonding hybridizations can be optimized for a given process.

An advantage of this invention is that the previously mentioned ion bombardment benefits of the PIIID method can be used to improve film adhesion and density. This is accomplished in the preferred embodiment by applying a negative pulsed DC bias to the workpiece with respect to the grounded anode. Since the DLC coating is an insulator, short pulses are used (1-20 microsec) to prevent excessive building of positive charge on the coating. This charge is compensated when the plasma sheath collapses during the off cycle. The workpiece or coating surface is bombarded by energetic positive ions created by the hollow cathode within the workpiece. The energy of the ions can be controlled by the magnitude of the applied voltage and by the pressure (higher pressure causing more collisions, resulting in lower energy for a given voltage).

A further advantage of the invention is that a multi-step process can be used to tailor the film qualities deposited on the internal surface of the welded workpiece. The surface of the workpiece can also be pre-cleaned by the introduction of a sputtering gas such as Ar in the first step of the method, following pump down to $1 \times 10^{-3}$ Torr pressure or preferably $1 \times 10^{-4}$ Torr. Contaminants on the interior surface of the workpiece are sputtered off when the negative DC pulse is applied. A second step can then be performed using carbon implantation to form a subsurface carbon layer in the steel. This layer improves the adhesion of the DLC. This is done by increasing the magnitude of the bias to greater than 5 kV. Care must be taken at this step for small diameter tubes, so that the size of the plasma sheath does not become larger than the radius of the tube. The formula for the smallest radius of a cylinder for which the sheaths do not overlap is as follows:

$$d = \sqrt{\frac{4\varepsilon\, V}{en}}$$

where V is the magnitude of the voltage, and n is the plasma density.

Following this implantation step, DLC deposition steps are performed using the above-mentioned methane, acetylene or toluene precursors. The DC pulse voltage is reduced in this process step to provide thin film deposition instead of implantation (e.g., 100 V-10 kV). Argon is also mixed with the carbon-containing precursors during these coating steps. In one embodiment of the invention, to control sputtering versus deposition rate and thus provide a more uniform coating down the tube, coating material is continuously sputtered off the entrance portion of the tube, wherein the sputtered material is drawn by flow velocity toward the rear end of the tube. Uniformity is also controlled by the duty cycle of the DC pulse, such that when the pulse is "off," the source gas is allowed to replenish and flow down the tube. One skilled in the art will recognize that uniformity is also controlled by the selections of the gas flow rate and the pumping speed.

DETAILED DESCRIPTION

Figure 1:
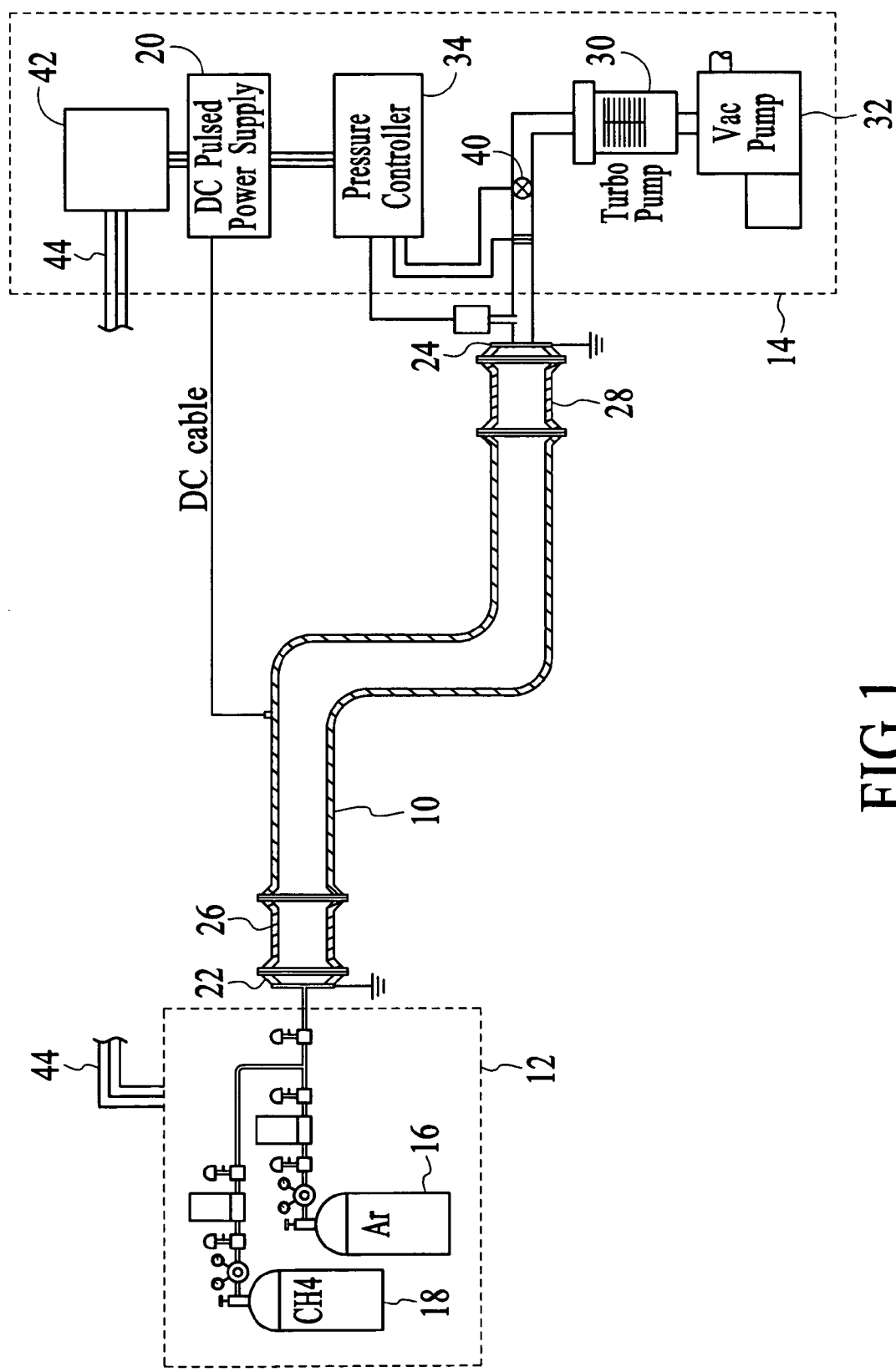
FIG. 1 is a functional view of an in-the-field coating apparatus in accordance with one embodiment of the invention.

With reference to FIG. 1, a conductive piping, or "workpiece," 10 is shown as being connected to a system that includes a gas supply subsystem 12 and a process control subsystem 14. The workpiece is shown as a single piece, but may be an assembly of tubes or pipes. The assembly should have all welding and assembly steps completed and should be leak tested prior to the coating process to be described below. A readily available non-toxic carbon containing gas, such as methane or acetylene, is provided by a first gas supply container 16. This gas is used to form a diamond-like carbon (DLC) coating on the inside of the workpiece. Argon (or other sputter gas) is provided from a second gas supply container 18 to allow plasma "pre-cleaning" of the pipe surface, and mixing of Ar and carbon-containing gas.

A DC pulsed power supply 20 is used to apply a negative bias to the workpiece 10. This bias is used to (a) create a plasma between a cathode and a grounded anode, (b) draw an ionized reactive gas to the surfaces to be coated, (c) allow ion bombardment of the film to improve film properties such as density and stress levels, and (d) allow control of film uniformity by adjusting duty cycle so as to permit replenishment of the source gas during the "off" portion of the cycle. Here, the workpiece functions as the cathode and there are grounded anodes 22 and 24 at the opposite ends of the workpiece. An entrance insulator 26 separates the entrance anode 22 from the workpiece, while an exit insulator 28 electrically isolates the workpiece from the grounded anode 24 at the exit end.

A turbo pump 30 and a vacuum pump 32 draw gas from the interior of the workpiece 10 through the exit end. A pressure controller 34 receives information from an optical probe and a langmuir probe, which is placed such that the optical probe has a line-of-sight into the plasma and the langmuir probe contacts the plasma. The two probes sense plasma intensity and generate information indicative of the intensity level. This information is used by the controller to determine a proper setting for an adjustable flow member 40, which may be a valve. The setting should be such that the pressure inside the workpiece 10 establishes a condition in which the electron mean free path is slightly less than the inner diameter of the workpiece, causing electron oscillation and increased ionizing collisions by the "hollow cathode" effect. Thus, a more intense plasma is generated within the workpiece. Since the electron mean free path increases as the pressure decreases, it is necessary to decrease pressure as the pipe diameter increases. For example, a quarter inch (6.35 millimeter) diameter gasline will generate a hollow cathode plasma at a pressure of approximately 200 mTorr, while a four inch (101.6 millimeter) diameter pump exhaust duct would generate a plasma at a pressure of approximately 12 mTorr. These are intended to be approximate values to show the general trend of lower pressure with larger diameter, but the pressure range can vary significantly from these values and still maintain a hollow cathode plasma.

The degree of ionization or plasma intensity is important for the PIIID technique to be effective, since it is only the ionized gas that is accelerated across the plasma sheath into the workpiece. The hollow cathode effect provides a more intense plasma than is otherwise available in DC or RF plasmas. This increase in intensity is available without the complications of other means of generating intense plasmas, such as magnets or microwave plasma sources which would be very difficult to implement for internal surfaces, particularly for "in the field" applications. The process also eliminates the need for separate heating of the workpiece 10. The optical and langmuir probes are located at the anode end connections to monitor when the intense hollow cathode is properly generated.

Computer software control 42 is shown as being connected to the DC pulsed power supply 20 and the pressure controller 34. In addition, the computer software control is able to generate and transmit control signals via an interface cable 44 to the gas supply subsystem 12 for the purpose of governing operations.

Figure 2:
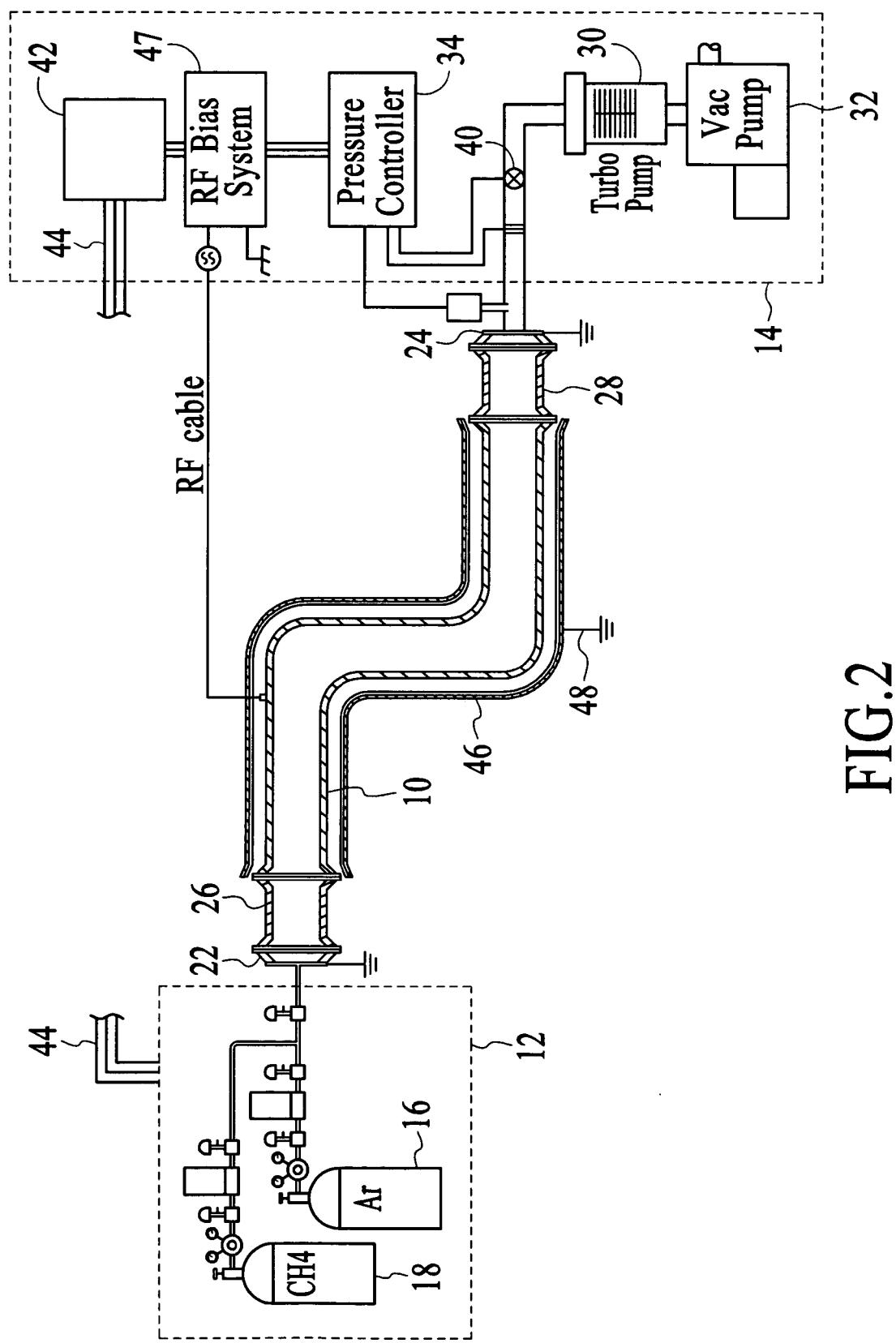
FIG. 2 is a functional view of a second embodiment of an in-the-field coating apparatus in accordance with the invention.

Another embodiment of the invention is shown in FIG. 2. Here, the system has been modified to operate under RF power, with the workpiece 10 being contained within an insulator blanket 46 with RF shielding 48. Reference numerals of FIG. 1 are applied to the system of FIG. 2, where the components are identical. The pulsed power supply of FIG. 1 is replaced by an RF supply 47 and the anode configuration must be modified such that the anode area is larger than the cathode. Moreover, a blocking capacitor (in the matching network) must be added to allow an induced negative voltage on the cathode. This voltage is determined by the formula $V_p/V_g = (A_g/A_p)q$, where the subscript p denotes the power electrode (the workpiece 10) and the subscript g denotes the grounded anodes 22 and 24, and where q varies between 1.25 and 2.5. Alternatively, a DC pulse could be superimposed on the RF power, eliminating the need for the induced negative cathode voltage.

Figure 3:
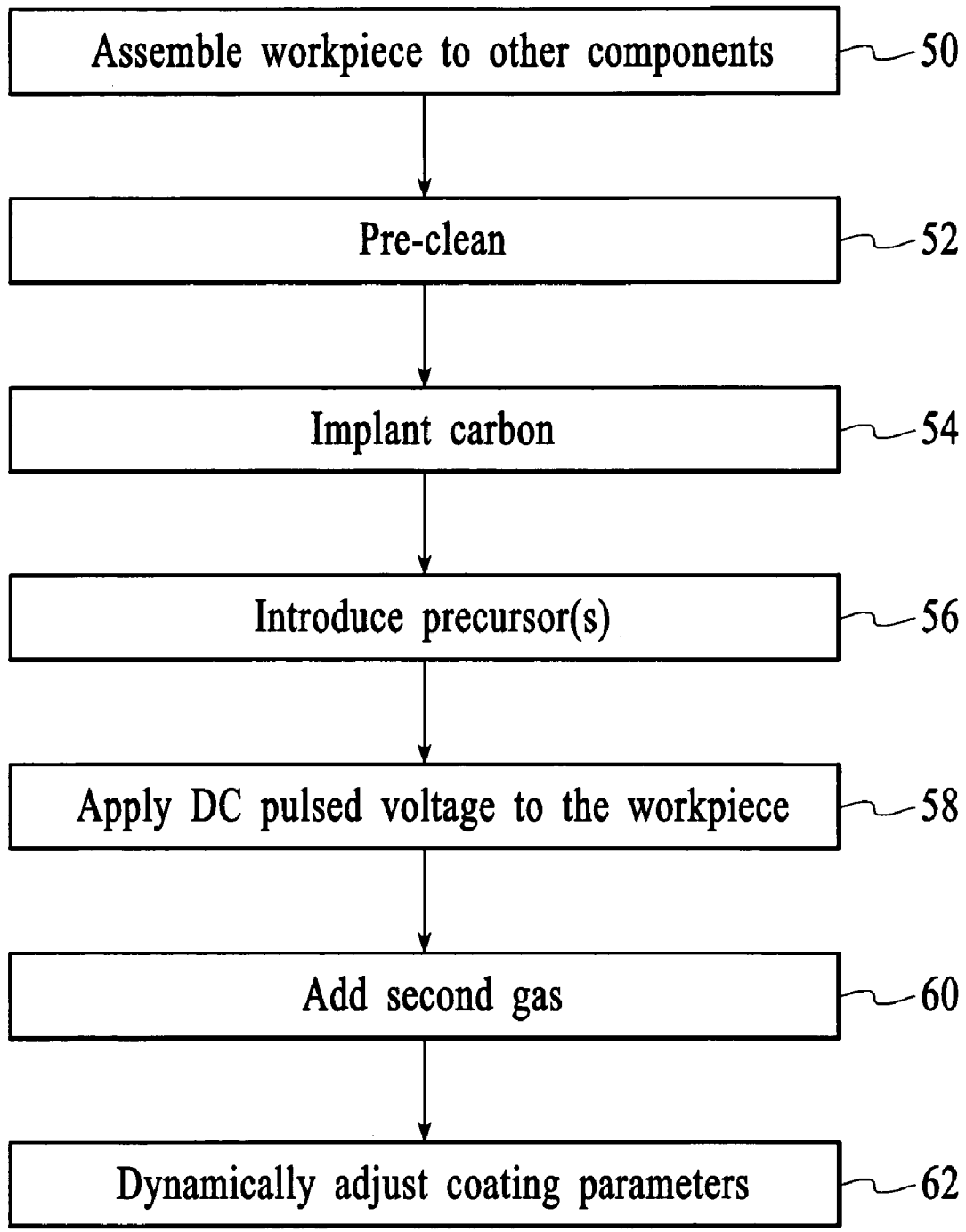
FIG. 3 shows a process flow of steps for implementing the invention.

One embodiment of process flow will be described with reference to FIGS. 1 and 3. At step 50, the workpiece is assembled to other components of a tubing system, so that the workpiece does not have to be heated following the completion of the interior coating process. Thus, all welding steps involving the workpiece are completed to apply a coating material to the interior of the workpiece. As previously noted, while the workpiece is shown as being a unitary tube, the workpiece may be an assembly of tubes or parts. Moreover, there may be a number of paths through the workpiece, rather than the non complex workpiece shown with a single entrance and a single exit.

At step 52, pre-cleaning occurs. The pre-cleaning may be an introduction of a sputtering gas, such as argon, from the first gas supply container 16. The pre-cleaning may be initiated after pump down to $1 \times 10^{-3}$ Torr or preferentially below $1 \times 10^{-4}$ Torr. Contaminants on the interior surface of the workpiece are sputtered off when a negative DC pulse is applied via the power supply 20.

An optional step 54 of implanting carbon may be used in some applications. Carbon implantation forms a subsurface carbon layer in the workpiece material, which may be stainless steel. This layer improves the adhesion to DLC and other materials. Carbon implantation is provided at a higher magnitude bias than experienced in the other steps of the coating process. A suitable bias is one which exceeds 5 kV. Care must be taken at this step for small diameter tubes, so that the size of the plasma sheath does not become larger than the radius of the workpiece.

Following the optional implantation step 54, at least one precursor is introduced at step 56 into the workpiece 10. Acceptable precursors include methane, acetylene or toluene. The DC pulsed voltage is reduced in this process step in order to provide thin film deposition, rather than implantation. The application of a DC pulsed voltage is represented by step 58 in FIG. 3. During the coating step, argon may be mixed with the carbon-containing precursors, as indicated at step 60.

In step 62, the coating parameters are dynamically adjusted during the coating process. The probes provide information that can be used by the computer software control 42 and the pressure controller 34 to maintain various parameters within their ranges of tolerance. Thus, the factors which determine pressure within the workpiece can be adjusted as needed or the magnitude and duty cycle of the pulsed bias may be adjusted, if necessary.

What is claimed is:

1. A method of applying material to internal surfaces of a conductive workpiece comprising:
    attaching anodes at openings of said conductive workpiece while maintaining electrical isolation of said anodes from said conductive workpiece, said openings including at least one entrance and at least one exit;
    connecting a biasing system such that said conductive workpiece functions as a cathode;
    coupling a vacuum source to each said exit of said conductive workpiece;
    coupling a source of gas to each said entrance of said conductive workpiece to introduce a gas that includes said material to be applied for formation with said conductive workpiece, wherein coupling said vacuum source includes pumping said interior of said conductive workpiece to a low pressure prior to introducing said gas so as to create a stable pressure within said interior, said biasing system being configured to apply a voltage bias between said conductive workpiece and said anodes such that a plasma is generated within said interior; and
    regulating said source of gas and said vacuum source such that pressure within said interior remains related to an interior diameter of said conductive workpiece so as to maintain a condition in which plasma intensity within said interior is adjustable via variations of said biasing system, wherein said condition establishes a hollow cathode effect.

2. The method of claim 1 further comprising monitoring said condition by using optical and langmuir detectors to generate information for feedback to a control system which initiates introduction of said material into said internal surfaces.

3. The method of claim 1 wherein connecting said biasing system includes applying a negative pulsed DC voltage to said conductive workpiece, including basing selection of a duty cycle such that:
    when said voltage is "on," a negative voltage is applied to said conductive workpiece such that positive source gas ions within a hollow cathode plasma generated in an interior of said conductive workpiece are attracted to said internal surfaces and react chemically to coat said internal surfaces; and
    when said voltage is "off," said positive source gas ions are sufficiently replenished within said interior to provide uniformity in coating said internal surfaces.

4. The method of claim 3 wherein said selecting said duty cycle is further based upon allowing dissipation of positive charge along said internal surfaces as a consequence of coating said internal surfaces, wherein said coating material is an insulator.

5. The method of claim 1 wherein coupling said source of gas includes furnishing a source gas of hydrocarbon having diamond-like carbon as said material to be applied to said internal surfaces as a coating.

6. The method of claim 1 wherein coupling said source of gas includes furnishing one of methane, acetylene and toluene.

7. The method of claim 1 further comprising pre-cleaning said internal surfaces by using a gas having sputtering atoms and by applying a negative bias to said conductive workpiece to sputter contaminants from said internal surfaces.

8. The method of claim 7 wherein said gas used for said pre-cleaning is one of argon or an argon/hydrocarbon mixture.

9. The method of claim 8 wherein said gas is also introduced during coating of said internal surfaces to provide re-sputtering of a coating formed during applying said material to said internal surfaces, thereby improving uniformity of said coating along a length of said internal surfaces.

10. The method of claim 1 further comprising providing a preliminary carbon implantation subsurface layer by applying a negative bias to said conductive workpiece and introducing a hydrocarbon gas, thereby improving adhesion to diamond-like carbon, wherein said diamond-like carbon is said material to be applied to said internal surfaces and said material forms a coating.

11. The method of claim 10 wherein connecting said biasing system includes applying a DC pulsed bias to establish ion bombardment energy and includes controlling properties of said coating of diamond-like carbon by varying the magnitude of said DC pulsed bias.

12. The method of claim 11 wherein controlling said properties further includes introducing source gases having different levels of carbon content, either simultaneously or successively.

13. The method of claim 1 further comprising assembling said conductive workpiece prior to said coupling of said source of gas, wherein said assembling includes welding a plurality of components together.

14. The method of claim 1 wherein said biasing system is a radio frequency (RF) voltage source with induced negative bias on said conductive workpiece.

15. The method of claim 1 wherein said biasing system is an RF source with a negative DC pulsed voltage superimposed on said conductive workpiece.

16. A system for applying material to internal surfaces of a conductive workpiece comprising:
    anodes coupled to openings of said workpiece while remaining electrically isolated from said workpiece and from each other with respect to connection via an interior of said workpiece;
    a biasing system connected to said workpiece to establish said workpiece as a cathode;
    a vacuum source connected to at least one said opening to evacuate gas from said workpiece;
    a gas source connected to at least one said opening to introduce a gas that includes a material to be applied to said internal surfaces of said workpiece; and a control system configured to regulate said vacuum source and said gas source such that pressure within an interior of said workpiece remains related to an interior diameter of said workpiece to establish a condition that exhibits a hollow cathode effect in which plasma intensity is adjustable via variations of said biasing system, wherein said biasing system is configured to apply a voltage bias such that a plasma is generated within said workpiece.

17. The system of claim 16 further comprising detectors positioned to monitor said plasma intensity and to generate feedback information indicative of said plasma intensity.

18. The system of claim 16 wherein said biasing system applies a negative pulsed DC voltage to said workpiece, said voltage having a duty cycle that is selected such that:

when said voltage is "on," a negative bias is applied to said workpiece such that positive source ions within a hollow cathode plasma are attracted to said internal surfaces of said workpiece and react therewith; and when said voltage is "off," said positive source ions are sufficiently replenished within said workpiece to provide uniformity of coating along a length of said internal surface.

19. The system of claim 18 wherein said gas source furnishes a hydrocarbon having a diamond-like carbon as said material to be applied to said internal surfaces as a coating.

20. The system of claim 16 wherein said biasing system includes an RF voltage source and a means for applying a negative bias to said workpiece.

21. The system of claim 16 wherein said biasing system includes an RF voltage source and a means for superimposing a negative DC pulsed voltage onto said workpiece.

22. A method of applying material to internal surfaces of a conductive workpiece comprising:

attaching anodes at openings of said conductive workpiece while maintaining electrical isolation of said anodes from said conductive workpiece and maintaining electrical isolation of said anodes from each other with respect to connection via an interior of said conductive workpiece, said openings including at least one entrance and at least one exit;

connecting a biasing system such that said conductive workpiece functions as a cathode;

coupling a vacuum source to each said exit of said conductive workpiece; and coupling a source of gas to each said entrance of said conductive workpiece to introduce a gas that includes said material to be applied for formation with said conductive workpiece, such that said material is applied along said internal surfaces without inserting a source electrode of said material into said interior of said conductive workpiece.

23. The method of claim 22 wherein coupling said vacuum source includes pumping said interior of said conductive workpiece to a low pressure prior to introducing said gas so as to create a stable pressure within said interior, said biasing system being configured to apply a voltage bias between said conductive workpiece and said anodes such that a plasma is generated within said interior.

24. The method of claim 23 further comprising regulating said source of gas and said vacuum source such that pressure within said interior remains related to an interior diameter of said conductive workpiece so as to maintain a condition in which plasma intensity within said interior is adjustable via variations of said biasing system, wherein said condition establishes a hollow cathode effect.

25. The method of claim 22 wherein connecting said biasing system includes applying a negative pulsed DC voltage to said conductive workpiece, including basing selection of a duty cycle such that:

when said voltage is "on," a negative voltage is applied to said conductive workpiece such that positive source gas ions within a hollow cathode plasma generated in an interior of said conductive workpiece are attracted to said internal surfaces and react chemically to coat said internal surfaces; and when said voltage is "off," said positive source gas ions are sufficiently replenished within said interior to provide uniformity in coating said internal surfaces.

* * * * *